United States Patent [19]

Tanaka

[11] 4,140,930
[45] Feb. 20, 1979

[54] VOLTAGE DETECTION CIRCUIT COMPOSED OF AT LEAST TWO MOS TRANSISTORS

[75] Inventor: Shinichi Tanaka, Nara, Japan

[73] Assignee: Sharp Kabushiki Kaisha, Osaka, Japan

[21] Appl. No.: 820,320

[22] Filed: Jul. 29, 1977

[30] Foreign Application Priority Data

Jul. 30, 1976 [JP] Japan .............................. 51-103758[U]
Jul. 30, 1976 [JP] Japan .............................. 51-103759[U]

[51] Int. Cl.² ...................... H03K 17/20; H03K 17/22; H03K 17/30; H03K 17/60
[52] U.S. Cl. ................................ 307/362; 307/200 B; 307/251; 307/279; 328/48
[58] Field of Search ........................ 58/23 BA, 152 H; 307/200 B, 251, 279, 362, 363, 304; 328/48; 340/248 B, 249

[56] References Cited

U.S. PATENT DOCUMENTS

| | | | |
|---|---|---|---|
| 3,628,070 | 12/1971 | Heuner et al. ......................... | 307/304 |
| 3,875,430 | 4/1975 | Prak ..................................... | 307/304 X |
| 3,898,790 | 8/1975 | Takamune et al. ................. | 58/23 BA |
| 3,949,545 | 4/1976 | Chihara .............................. | 58/23 BA |
| 4,013,902 | 3/1977 | Payne .................................. | 328/48 X |
| 4,024,415 | 5/1977 | Matsuura ............................. | 307/362 |
| 4,025,865 | 5/1977 | Munday et al. ..................... | 328/48 X |
| 4,037,399 | 7/1977 | Chihara .............................. | 58/23 BA |
| 4,043,110 | 8/1977 | Chihara .............................. | 58/23 BA |
| 4,043,112 | 8/1977 | Tanaka ............................... | 58/23 BA |
| 4,045,688 | 8/1977 | Stewart .............................. | 328/48 X |

FOREIGN PATENT DOCUMENTS

2433328 1/1976 Fed. Rep. of Germany ........... 307/304

Primary Examiner—Larry N. Anagnos
Attorney, Agent, or Firm—Birch, Stewart, Kolasch & Birch

[57] ABSTRACT

A voltage level detection circuit comprises a first MOS transistor having the gate and the drain connected together with a power source voltage $V_{DD}$ via a resistor and the source grounded and a second MOS transistor having the gate connected with the drain of the first MOS transistor and the source grounded via a resistor. The circuit functions to compare the power source voltage $V_{DD}$ with a sum of the threshold voltage levels of the first and second MOS transistors, whereby voltage detection outputs are developed at the source of the second MOS transistor.

7 Claims, 14 Drawing Figures

VOLTAGE DETECTION CIRCUIT COMPOSED OF AT LEAST TWO MOS TRANSISTORS

BACKGROUND OF THE INVENTION

The present invention relates to an improvement in a voltage level detection circuit which senses whether a power source voltage drops below a given voltage level.

A typical prior art voltage level detection circuit as shown in FIG. 1 is well known. In the drawing $T_1$ through $T_4$ designate MOS transistors, $R_1$ and $R_2$ designate resistors, P designates a P-channel type MOS transistor, and N designates an N-channel type MOS transistor. $T_2$ and $T_4$ form an inverter circuit. In addition, $E_1$ represents a power source voltage such as a battery with the cathode connected with a utility circuit and the anode grounded, and $E_2$ and $E_3$ represents potentials at respective nodes.

When the power voltage $E_1$ is increased above the threshold voltage $VH_3$ of the MOS transistor $T_3$, the transistor $T_3$ is turned ON and $E_2$ is increased to the ground potential. This means that the transistor $T_1$ is turned ON too and the drain potential $E_3$ of $T_1$ is equal to the power source voltage $E_1$. In other words, the illustrated circuit compares the power source voltage $E_1$ with the threshold voltage of the P channel or N channel MOS transistor and then detects a drop in the power source voltage. FIGS. 4(a) and 4(b) are voltage characteristic charts showing a relationship between the voltages $E_1$ and $E_2$. However, design of such a circuit arrangement is relatively difficult because the MOS transistor should be driven in a normal mode up to near the threshold voltage level. Therefore, the resistor $R_1$ is smaller and the decision level $E_1$ is higher in practical use as depicted by the broken line in FIGS. 4(a) and 4(b). This approach, however, results in increase of current flowing through the resistor $R_1$ and the transistor $T_3$ and in other words, increase of consumption current. The battery is often renewed.

Accordingly, it is an object of the present invention to provide a voltage level detection circuit with less power consumption.

In accordance with the voltage level detection circuit of the present invention, a power source voltage is compared with reference to the threshold voltage of an MOS transistor and the results of such comparison are developed as voltage level detection outputs. The level detection circuit is comprised of a first MOS transistor having the gate and the drain connected together with a power source voltage $V_{DD}$ ($E_1$) via a resistor and the source grounded and a second MOS transistor having the gate connected with the drain of the first MOS transistor and the drain grounded via a resistor.

BRIEF DESCRIPTION OF THE DRAWINGS

Other objects and novel features of the present invention as set forth in the appended claims and the present invention as to its organization and its mode of operation will best be understood from a consideration of the following detailed description of the preferred embodiments taken in connection with the accompanying drawings, wherein:

DETAILED DESCRIPTION OF THE INVENTION

Figure 1:
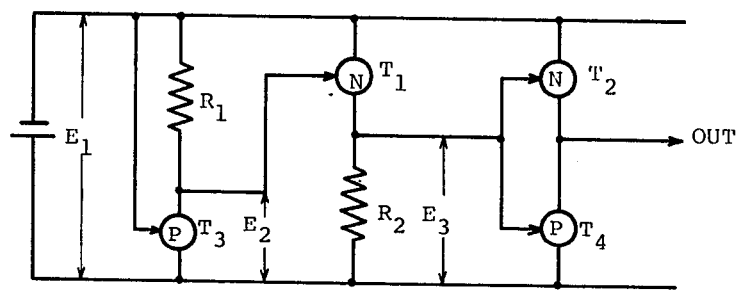
FIG. 1 is a circuit diagram of a prior art voltage level detection circuit.
Figure 2:
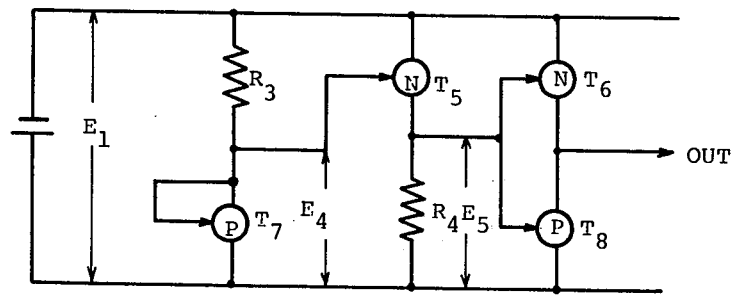
FIG. 2 is a circuit diagram of an embodiment of a voltage level detection circuit embodying the present invention.

FIG. 2 illustrates a circuit diagram of an embodiment of the present invention which includes a first MOS transistor $T_7$ having the gate and the drain connected together with a power supply voltage $E_1$ via a resistor $R_3$ and the source grounded and a second MOS transistor $T_5$ having the gate connected with the drain of the first MOS transistor $T_7$ and the drain grounded via a resistor $R_4$. The drain of the second MOS transistor $T_5$ is connected with the gate of an inverter composed of a couple of MOS transistors $T_6$ and $T_8$. The inverter drives voltage detection outputs.

Figure 5:
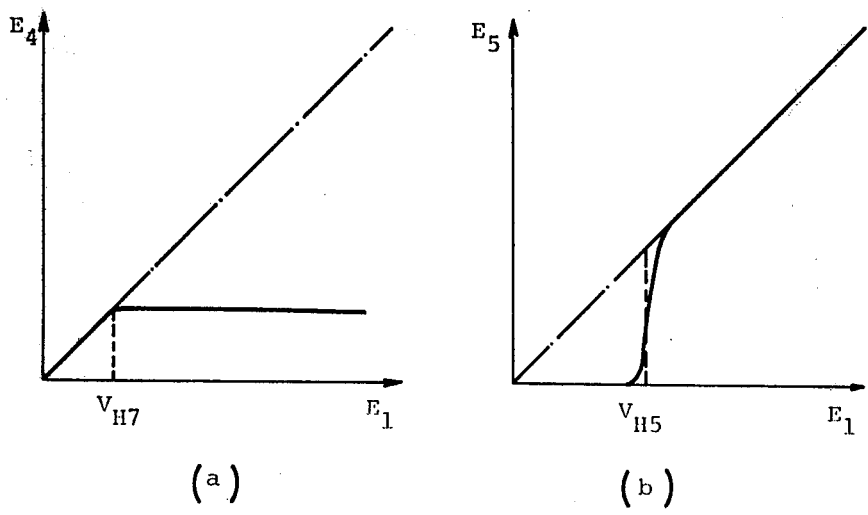

FIGS. 5(a) and 5(b) show the drain voltage $E_4$ of the MOS transistor $T_7$ and the drain voltage $E_5$ of the MOS transistor $T_5$ against the power supply voltage $E_1$. If the power supply voltage $E_1$ is below the threshold voltage $VH_7$ of the MOS transistor $T_7$, then the MOS transistor $T_7$ is turned OFF with $E_4$ being the same as the potential $E_1$.

When $E_1$ is increased above the threshold voltage of $T_7$, this makes the gate voltage $E_4$ of $T_5$ fixed near the threshold voltage $VH_7$ as shown in FIG. 5(a). If a potential difference between $E_1$ and $E_4$ is below the threshold voltage $VH_5$ of $T_5$, $T_5$ remains in the OFF state and $E_5$ remains at the ground potential.

Thereafter, the difference between $E_1$ and $E_4$ exceeds the threshold voltage $VH_5$ of $T_5$ so that $T_5$ is turned ON and $E_5$ is equal to $E_1$ as shown in FIG. 5(b). It is obvious from FIG. 5(a) that $E_4$ is kept at a fixed level as long as the threshold voltage of $T_7$ is reached and that a potential variation in $E_5$ is developed at a sum of the P channel and N channel threshold voltages. This voltage value corresponds to a detection level. Therefore, by corresponding a desired driving voltage to the threshold voltages of the respective transistors it is able to sense drop in the power supply voltage.

The above-mentioned resistors $R_3$ and $R_4$ are load resistors for the MOS transistors $T_7$ and $T_5$. These resistance values may be high enough to avoid unstable operation by noise, etc., so that current flowing through $T_7$ and $T_5$ is remarkably small. As a result, less power consumption voltage detection is achieved.

Figure 3:
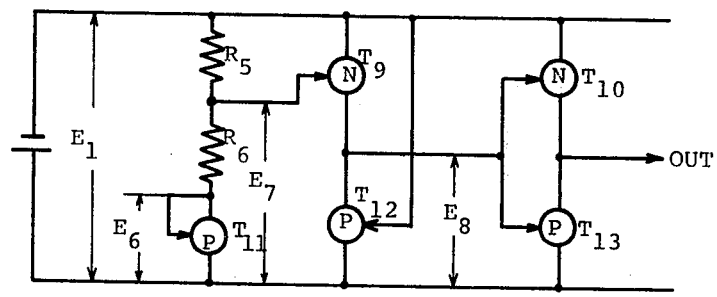
FIG. 3 is a circuit diagram of another embodiment of the present invention.
Figure 4:
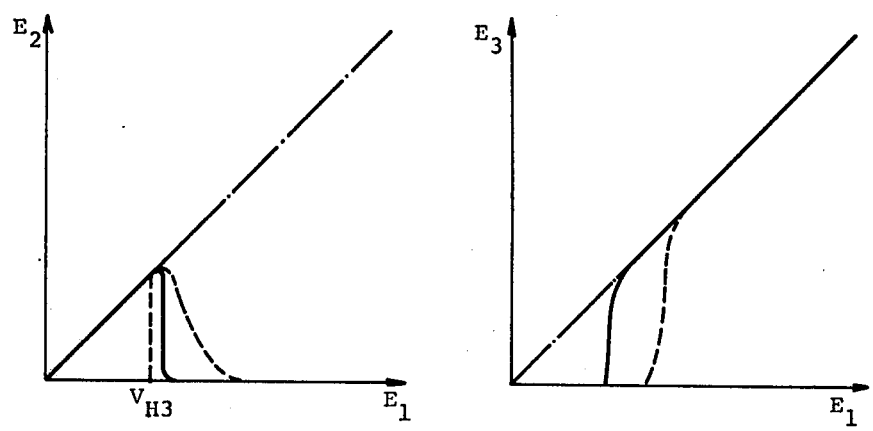
FIGS. 4(a), 4(b), 5(a) and 5(b), 6(a) through 6(c) are diagrammatic charts showing respective node potentials against a power voltage $E_1$.

FIG. 3 shows a circuit diagram of another embodiment of the present invention wherein a series circuit of resistors $R_5$ and $R_6$ is provided instead of the resistor $R_3$ of FIG. 2 and the junction of $R_5$ and $R_6$ is connected with the gate of an MOS transistor $T_9$. The remaining portion is identical with the implementation shown in FIG. 2.

When a potential difference between the power supply voltage $E_1$ and the gate voltage $E_7$ of the MOS transistor $T_9$ exceeds the threshold voltage $VH_9$ of the MOS transistor $T_9$, voltage detection is achieved. The gate potential $E_7$ is a potential divided by the resistors $R_5$ and $R_6$ and more particularly a portion of the potential difference between the power supply voltage $E_1$ and the drain voltage $E_6$ of a MOS transistor $T_{11}$ which is determined by a division ratio of the resistors $R_5$ and $R_6$. The gate potential $E_7$ is therefore higher than the potential $E_4$ as shown by FIG. 2. This implies that the detection level is higher than that in the circuit of FIG. 2.

Figure 6:
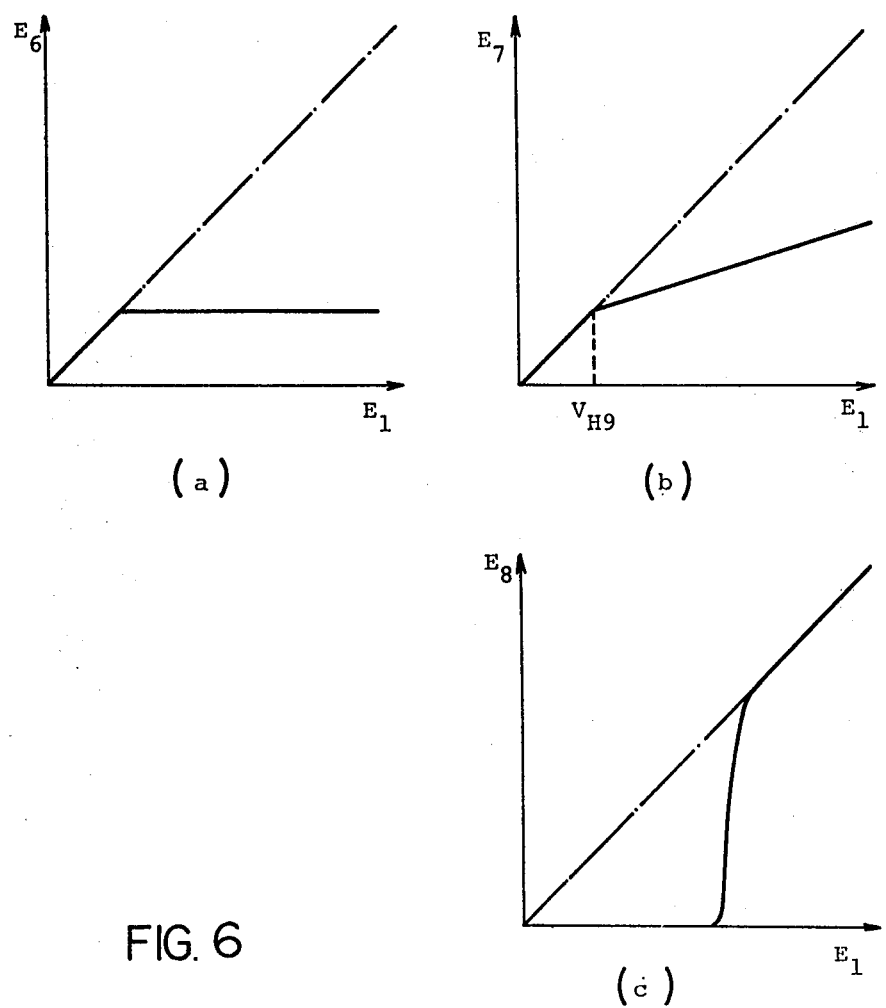

FIGS. 6(a) through 6(c) show variations of potentials $E_6$, $E_7$ and $E_8$ at respective nodes as a function of the power supply voltage $E_1$. Although in FIG. 6(c) $E_8$ is varied from the zero level at a much higher level $E_1$ than that in FIG. 5(b), the amplitude of $E_1$ is optionally selectable by proper choice of the ratio of the resistor $R_5$ and $R_6$. Therefore, the detection level is also selectable. It will be noted that an MOS transistor $T_{12}$ is the substitution for the resistor $R_4$ of FIG. 2. In this case, such MOS resistor occupies a reduced area in implementating the circuit with the LSI technology.

Figure 7:
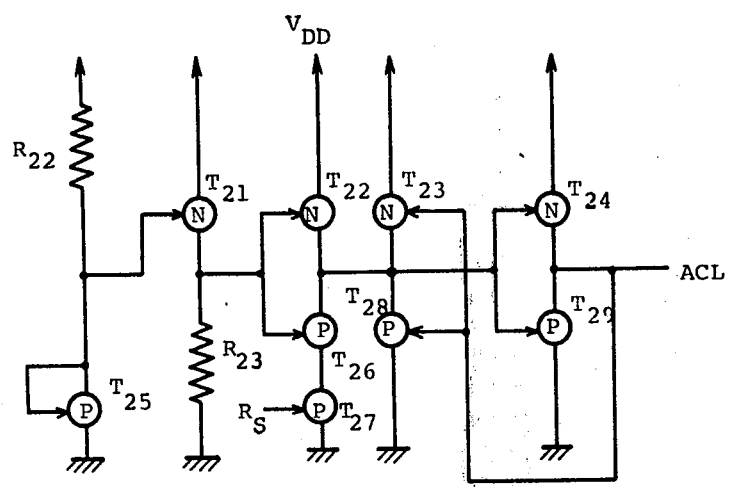
FIG. 7 is a circuit diagram of an example of application of the present invention.

The voltage level detection outputs can be utilized in a wide range of applications. An example of an application to an initial condition setting circuit is illustrated in FIG. 7 wherein $T_{21}$ through $T_{29}$ are C-MOS transistors and P designates P-channel transistors and N designates N-channel transistors. This includes a first MOS transistor $T_{25}$ having the drain and the gate connected together with a power supply voltage $V_{DD}$ via a resistor $R_{22}$ and the source grounded and a second MOS transistor $T_{21}$ having the gate connected with the drain of the first MOS transistor $T_{25}$, the source connected with the power supply voltage $V_{DD}$ and the drain grounded via a resistor $R_{23}$ and connected with the gates of $T_{22}$ and $T_{26}$ forming a C-MOS inverter. The output of the inverter is coupled with a set input or a reset input of a directly coupled flip-flop composed of $T_{23}$, $T_{24}$, $T_{28}$ and $T_{29}$. The output of the flip-flop serves as an initial condition setting signal ACL. A gate signal $R_5$ of $T_{27}$ is to reset the flip-flop. The power supply potential $V_{DD}$ is negative.

Figure 8:
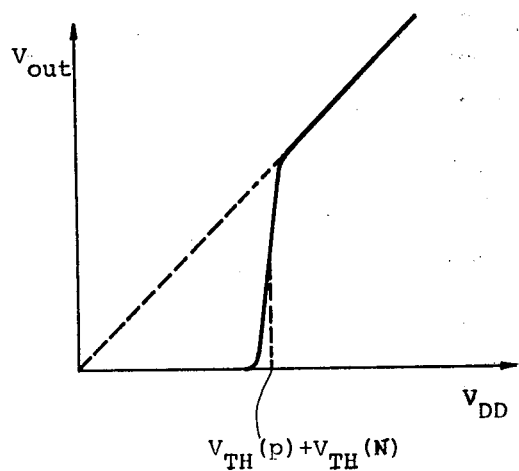
FIG. 8 is a diagrammatic chart showing a node potential $V_{out}$ against the power source voltage $V_{DD}$ ($E_1$)

A relationship between $V_{DD}$ and the drain potential of $T_1$ is shown in FIG. 8. $T_{22}$ and $T_{26}$ are inverted when $V_{DD}$ is increased above a sum of the threshold voltage $V_{TH(P)}$ of the P-channel transistor $T_{25}$ and that $V_{TH(N)}$ of the N-channel transistor $T_{21}$. Since the drain potential of $T_{21}$ is utilized as the set input of the flip-flop, the output ACL of the flip-flop bears the ground potential when the drain of $T_1$ is at the ground potential. If the drain of $T_1$ is at the potential $V_{DD}$, no set input is developed so that the flip-flop remains in the previous condition until the reset signal $R_5$ is applied to the gate of the transistor $T_{27}$. Therefore, when the power supply voltage $V_{DD}$ is below the sum of the threshold voltages, the ACL signal bears the ground potential and is impressed on other flip-flops or a register in order to establish an initial condition.

Figure 9:
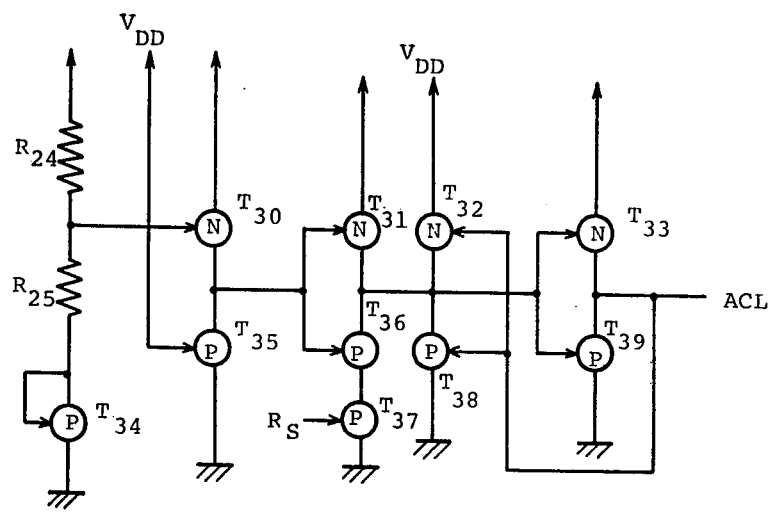
FIGS. 9 and 10 are circuit diagrams using modifications in the embodiment of FIG. 7.
Figure 10:
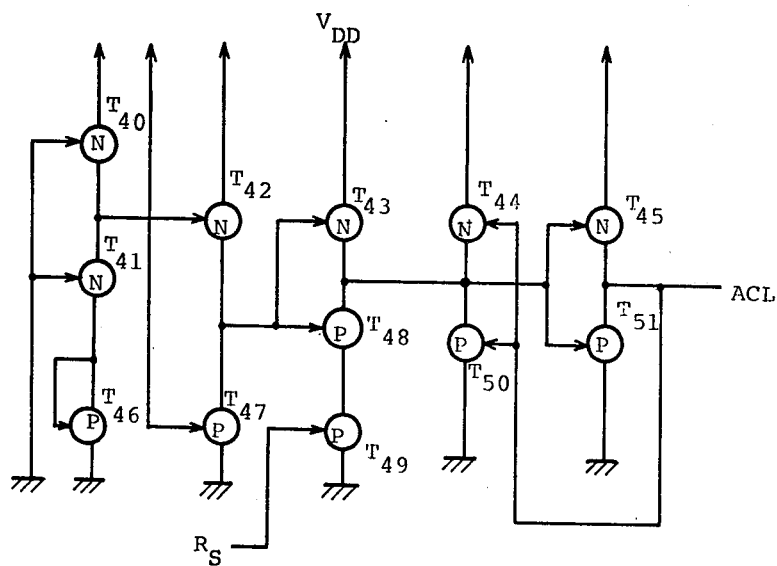

FIG. 9 is a modification of the embodiment shown in FIG. 7 wherein the resistor $R_{22}$ of FIG. 7 is divided into two resistors $R_{24}$ and $R_{25}$ and the junction of the resistors $R_{24}$ and $R_{25}$ is connected with the gate of a transistor $T_{30}$. A transistor $T_{35}$ is the substitution for the resistor $R_{23}$ of FIG. 7. FIG. 10 shows MOS transistors $T_{40}$ and $T_{41}$ provided instead of the resistors $R_{24}$ and $R_{25}$ of FIG. 9. In design of an LSI, a ratio of $T_{40}$ and $T_{41}$ can be varied to change the detection level.

While only certain embodiments of the present invention have been described, it will be apparent to those skilled in the art that various changes and modifications may be made therein without departing from the spirit and scope of the invention as claimed.

What is claimed is:

1. A voltage level detection and switching circuit comprising:
    a first MOS transistor;
    a second MOS transistor;
    a power source providing a source voltage;
    means for comparing the source voltage with the sum of the threshold voltage levels of said first and second MOS transistors;
    a flip-flop coupled to said comparison means, the output of said flip-flop being utilized as an initial condition setting signal;
    means for setting or resetting said flip-flop when the power source voltage exceeds the sum of the threshold voltage levels of said first and second MOS transistors.

2. A circuit in accordance with claim 1, wherein said comparison means comprises:
    means connecting the gate and drain of said first MOS transistor together;
    a resistor connected between said power source and the drain of said first MOS transistor;
    means for connecting the source of said first MOS transistor to ground;
    means for connecting the gate of said second MOS transistor with the drain of said first MOS transistor; and
    means for grounding the drain of said second MOS transistor via a resistor.

3. A circuit means in accordance with claim 2, wherein said resetting means comprises a P-channel transistor responsive to a reset signal.

4. A circuit in accordance with claim 1, wherein said comparison means comprises:
    means for connecting the gate and the drain of said first MOS transistor together;
    two resistors connected in series between the power source and the drain of said first MOS transistors;
    means for grounding the source of said first MOS transistor;
    means for connecting the gate of said second MOS transistor to a junction between said two series resistors in the drain circuit of said first MOS transistor; and
    means for connecting the drain of said second MOS transistor to ground via a third transistor.

5. A circuit means in accordance with claim 4, wherein said resetting means comprises a P-channel transistor responsive to a reset signal.

6. A circuit in accordance with claim 1, wherein said comparison means comprises:
    means for connecting the gate and the drain of said first MOS transistor together;
    two transistors in series connected between the drain of said first MOS transistor and said power source;
    means for connecting the source of said first MOS transistor ground;
    means for connecting the gate of said second MOS transistor to a junction between said two series transistors in the drain circuit of said first MOS transistor; and
    transistor means for connecting the drain of said second MOS transistor to ground.

7. A circuit means in accordance with claim 6, wherein said resetting means comprises a P-channel transistor responsive to a reset signal.

* * * * *